United States Patent [19]

Sevier et al.

[11] Patent Number: 5,004,107
[45] Date of Patent: Apr. 2, 1991

[54] EARTHQUAKE BRACED RACKS

[75] Inventors: Richard W. Sevier, Goleta; James J. Keenan, Santa Barbara, both of Calif.

[73] Assignee: Hendry Mechanical Works, Goleta, Calif.

[21] Appl. No.: 347,672

[22] Filed: May 5, 1989

[51] Int. Cl.⁵ .............................................. A47F 7/00
[52] U.S. Cl. ...................................... 211/26; 403/382
[58] Field of Search ................. 211/26; 52/238.1, 264, 52/698; 29/150, 462, 469, D48; 403/382

[56] References Cited

U.S. PATENT DOCUMENTS

| | | | |
|---|---|---|---|
| 1,957,362 | 5/1934 | Smith | 403/302 |
| 2,875,902 | 3/1959 | Ayars, Jr. | 403/382 X |
| 4,497,411 | 2/1985 | DeBortoli | 211/26 |
| 4,553,674 | 11/1985 | Yoshikawa et al. | 211/26 |
| 4,690,286 | 9/1987 | Horne et al. | 211/26 X |
| 4,715,502 | 12/1987 | Salmon | 211/26 |
| 4,732,281 | 3/1988 | Hall, II et al. | 211/26 |

FOREIGN PATENT DOCUMENTS

| | | | |
|---|---|---|---|
| 19881 | 2/1965 | Japan | 211/26 |
| 0815777 | 7/1959 | United Kingdom | 211/26 |
| 0983471 | 2/1965 | United Kingdom | 403/382 |

OTHER PUBLICATIONS

Lincoln Electric, "How Welding Simplifies the Design of Brackets," Product Engineering, Nov. 1948.

Primary Examiner—David L. Talbott
Assistant Examiner—Daniel Hulseberg
Attorney, Agent, or Firm—Benoit Law Corporation

[57] ABSTRACT

An electronic equipment rack including a horizontal frame member and a vertical frame member is braced against earthquake damage by means of a metal gusset having a first leg fitting against the horizontal frame member to extend along part of that horizontal frame member, a second leg fitting against the vertical frame member for a first part of that second leg to extend along part of that vertical frame member, a third leg spaced from and extending in parallel to a second part of the second leg, and a fourth leg extending between the second and third legs to abut against another part of the vertical frame member. Solid metal is carried from the vertical frame member to the horizontal frame member by intimately connecting the gusset to the vertical and horizontal frame members.

29 Claims, 2 Drawing Sheets

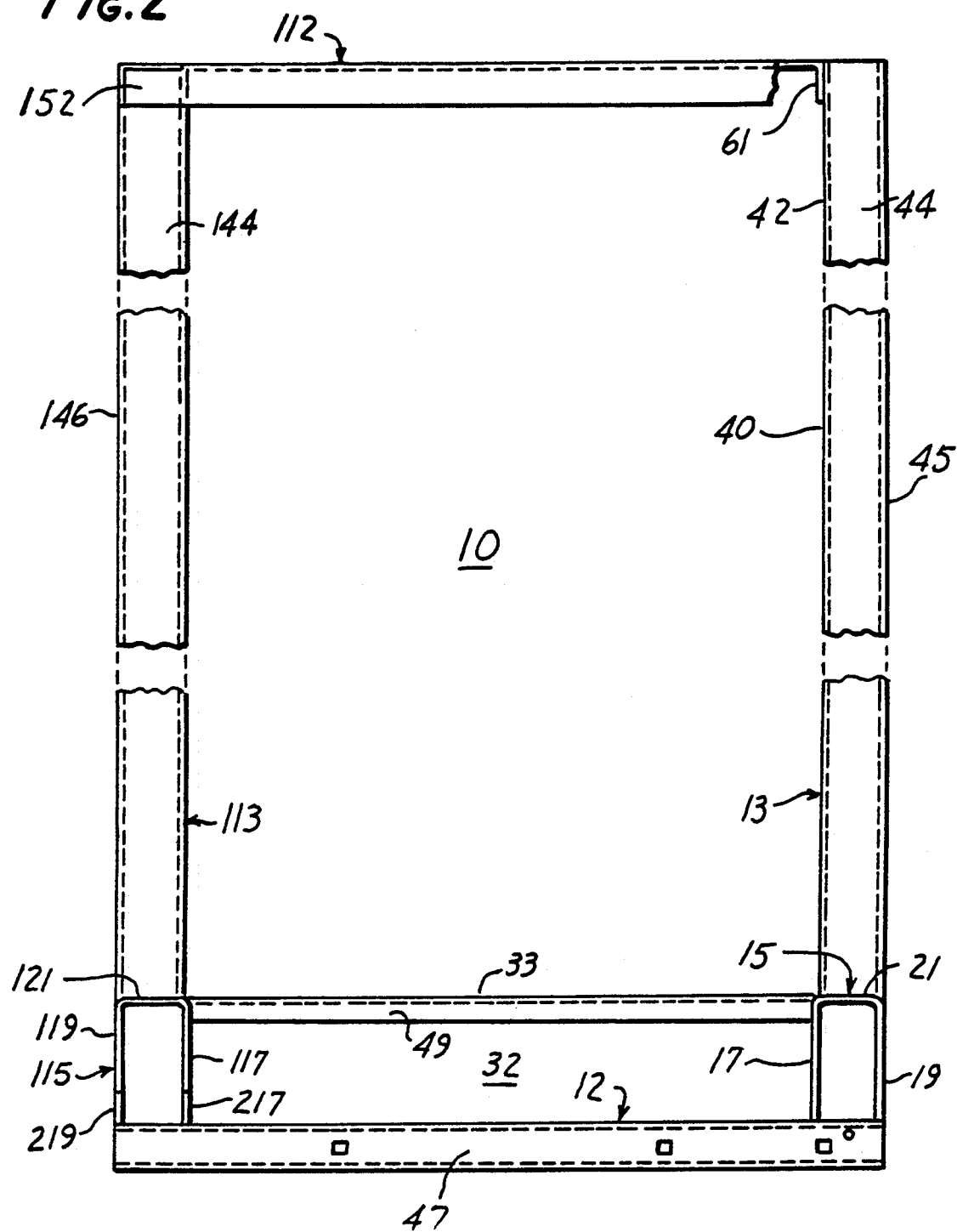

5,004,107

EARTHQUAKE BRACED RACKS

FIELD OF THE INVENTION

The subject invention relates to racks for electronic equipment and, more specifically, to methods and means for bracing such racks against earthquake damage, and to racks braced against earthquake damage.

BACKGROUND OF THE INVENTION

Preservation of electronic equipment during earthquakes and aftershocks for the maintenance of communications and other purposes is a major concern of earthquake preparedness. Indeed, alleviation of damage and suffering depends to a large extent on the maintenance of the telephone system and broadcast facilities, to name two examples.

With the introduction of electronic and fiber optic telephone switching equipment, the density of calls being handled in one equipment rack or network bay has advanced significantly. Today as many as 20,000 telephone lines could be interrupted with the loss of one bay of equipment. This has made the reliability cf telephone switch equipment and its supporting structure critically important. Concern for earthquake protection of this equipment has become very important.

Several approaches to solving these problems were tried. It may be possible to make an equipment rack or network bay that is strong enough to avoid earthquake damage by using heavier material and more bracing members, but this adds significantly to the cost. This would no longer be compatible with the competitive environment of modern telephone systems. Moreover, spot-welding and similar measures have not imparted sufficient earthquake resistance to prior-art types of equipment racks.

SUMMARY OF THE INVENTION

It is a general object of this invention to overcome the disadvantages to meet the needs expressed or implied hereinabove or hereinafter.

It is a germane object of the invention to provide improved methods of bracing electronic equipment racks against earthquake damage.

It is a related object of the invention to provide improved electronic equipment racks braced against earthquake damage.

Other objects of the invention will become apparent in the further course of this disclosure.

From one aspect thereof, the invention resides in a method of bracing an electronic equipment rack including a horizontal frame member and a vertical frame member against earthquake damage. The invention according to this aspect resides, more specifically, in the improvement comprising in combination the steps of providing a metal gusset for the horizontal and vertical frame members wherein the gusset has a first leg fitting against the horizontal frame member to extend along part of that horizontal frame member, a second leg integrally connected to and extending from a lateral edge of the first leg and fitting against the vertical frame member for a first part of the second leg to extend along part of that vertical frame member, a third leg spaced from and extending in parallel to a second part of the second leg, and a fourth leg extending between and integrally connected to lateral edges of the second and third legs to abut against another part of the vertical frame member, and carrying solid metal from the vertical frame member to the horizontal frame member by intimately connecting the gusset to the vertical and horizontal frame members by overlap welding.

From a related aspect therecf, the invention resides in an electronic equipment rack including a horizontal frame member and a vertical frame member braced against earthquake damage by the improvement comprising, in combination, a metal gusset intimately connected to the horizontal and vertical frame members by overlap welds and including a first leg fitting against the horizontal frame member and extending along part of that horizontal frame member, a second leg integrally connected to and extending from a lateral edge of the first leg and having a first part fitting against the vertical frame member and extending along part of that vertical frame member, a third leg spaced from and extending in parallel to a second part of the second leg, and a fourth leg extending between and integrally connected to lateral edges of the second and third legs and in abutment with another part of the vertical frame member.

Also from a related aspect thereof, the invention resides in an electronic equipment rack including a pair of spaced vertical frame members, a horizontal base frame member and a horizontal top frame member extending between these vertical frame members and being braced against earthquake damage by the improvement comprising, in combination, a first metal gusset intimately connected to the horizontal base frame member and a first one of the vertical frame members by overlap welds and including a first leg fitting against that horizontal base frame member and extending along part of that horizontal base frame member, a second leg integrally connected to and extending from a lateral edge of the first leg and having a first part fitting against the first vertical frame member and extending along part of that first vertical frame member, a third leg spaced from and extending in parallel to a second part of the second leg, and a fourth leg extending between and integrally connected to lateral edges of the second and third legs and in abutment with another part of the first vertical frame member, a second metal gusset intimately connected to the horizontal base frame member and the second one of the pair of vertical frame members by overlap welds and including a first leg fitting against that horizontal base frame member and extending along part of that horizontal base frame member, a second leg integrally connected to and extending from a lateral edge of the first leg and having a first part fitting against the second vertical frame member and extending along part of that second vertical frame member, a third leg spaced from and extending in parallel to a second part of the second leg of that second gusset, and a fourth leg extending between and integrally connected to lateral edges of these second and third legs of that second gusset and in abutment with another part of the second vertical frame member, spaced first and second lateral tabs on the horizontal top frame member extending over correspondingly spaced first and second portions of the first vertical frame member, and spaced third and fourth lateral tabs on that horizontal top frame member extending over correspondingly spaced first and second portions of the second vertical frame member, and overlap welds at the first, second, third and fourth tabs and the first and second portions of the first and second vertical frame members.

BRIEF DESCRIPTION OF THE DRAWINGS

The subject invention and its aspects and objects will become more readily apparent from the following detailed description of preferred embodiments thereof, illustrated by way of example in the accompanying drawings, in which like reference numerals designate like or equivalent parts, and in which:

FIG. 2 is an elevation of an electronic equipment rack braced against, earthquake damage in the manner shown in FIG. 1, and including a top structure braced against earthquake damage pursuant to a further embodiment of the subject invention.

DESCRIPTION OF PREFERRED EMBODIMENTS

Figure 1:
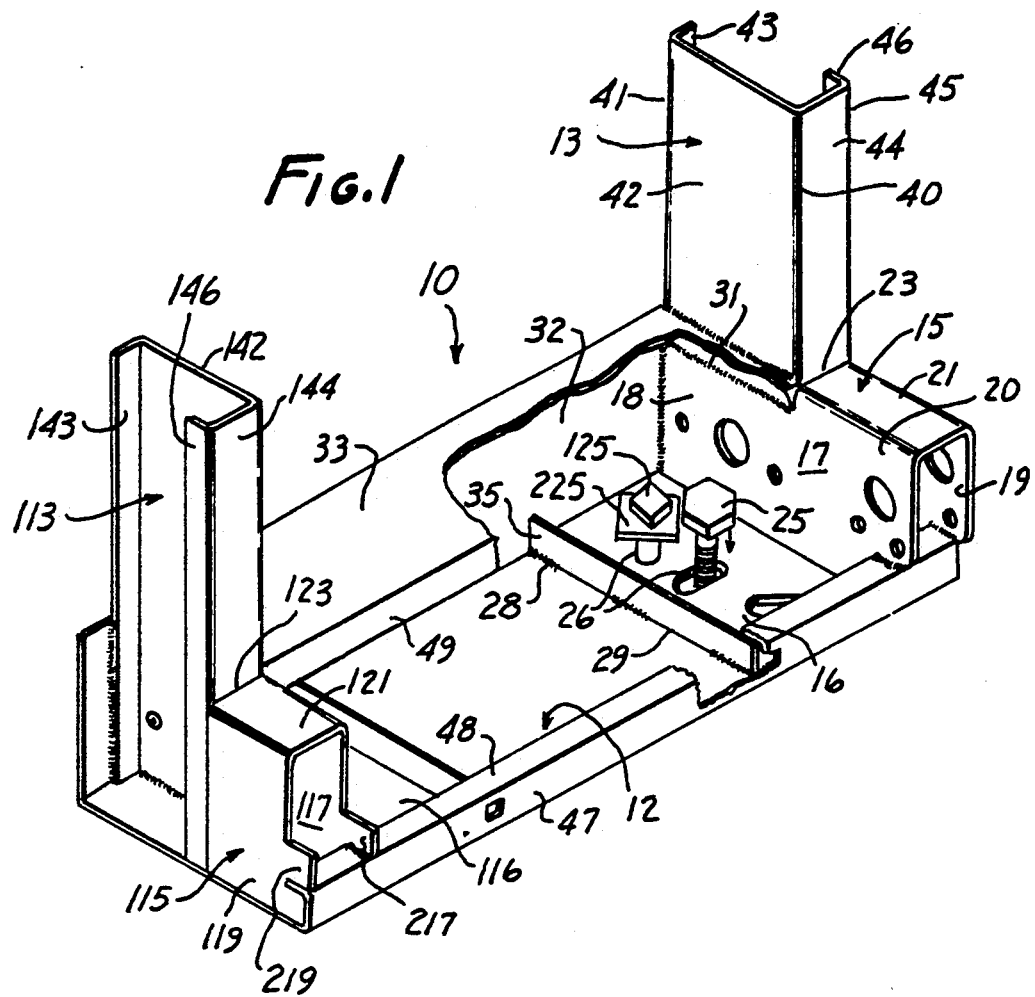
FIG. 1 is a perspective view of a lower portion of an electronic equipment rack braced against earthquake damage according to preferred embodiment of the subject invention.

The drawings illustrate methods of bracing an electronic equipment rack 10 including a horizontal frame member 12 and a vertical frame member 13 against earthquake damage. The drawings also show the electronic equipment rack 10 including the horizontal frame member 12 and the vertical frame member 13 braced against earthquake damage by the improvements herein disclosed.

In particular, an illustrated preferred embodiment of the invention provides a metal gusset 15 for horizontal and vertical frame members with a first leg 16 fitting against the horizontal frame member 12 to extend along part of that horizontal frame member. The gusset also has a second leg 17 fitting against the vertical frame member for a first part 18 of that second leg to extend along part of that vertical frame member 13. The gusset further has a third leg 19 spaced from and extending in parallel to a second part 20 of the second leg 17 and a fourth leg 21 extending between the second and third legs 17 and 19 to abut against another part 23 of the vertical frame member. That illustrated embodiment of the invention carries solid metal from the vertical frame member to the horizontal frame member by intimately connecting the gusset 15 to the vertical and horizontal frame members 13 and 12.

The horizontal and vertical frame members 12 and 13 are thus braced against earthquake damage by the metal gusset 15 intimately connected to these horizontal and vertical frame members and including the first leg 16 fitting against the horizontal frame member 12 and extending along part of that horizontal frame member, including a second leg 17 having a first part 18 fitting against the vertical frame member 13 and extending along part of that vertical frame member, including a third leg 19 spaced from and extending in parallel to a second part 20 of the second leg 17 and including a fourth leg 21 extending between the second and third legs 17 and 19 in abutment with another part of the vertical frame member 13. The fourth leg 21 may be recessed inwardly relative to the second and third legs 17 and 19. As seen in FIGS. 1 and 2, the tired and fourth legs 19 and 21 of the gusset 15 are formed with the second part 20 of the second leg into a channel-shaped structure extending in one piece with the first part 18 of that second leg 17 above the horizontal frame member 12 into abutment with the vertical frame member 13. The same applies to the second gusset 115 as also seen in FIGS. 1 and 2. As also shown in the drawings, the channel-shaped structure, which extends along a lateral part of the horizontal frame member 12 into abutment with a first flange 42 of the vertical frame member 13, is provided with or has an extension 18 along a second flange 42 of the vertical frame member 13. The channel-shaped structure and its extension 18 are provided with a leg 16 extending along part of the horizontal frame member 12. The extension 18 as shown is in one piece with the channel-shaped structure and is secured to the second flange 42 of the vertical frame member 13, preferably by overlap welding 31. The leg 16 is in one piece with the channel-shaped structure and with the extension 18 of the channel-shaped structure and is secured to the horizontal frame member 12, preferably by overlap welding 28.

The gusset as shown is intimately connected at its first leg 16 to the horizontal frame member 12. By way of example, the gusset may be bolted at its first leg 16 to the horizontal frame member 12. The same bolt 25 may be used for that purpose as for bolting the equipment rack to the floor. One or more square or other washers 225 may be provided between the head of the bolt 25 or of any other bolt 125 and the gusset leg 16, and the bolts or slots 26 through which they extend may be positioned differently than shown for best earthquake bracing.

According to an illustrated preferred embodiment of the invention, for optimum anti-earthquake bracing, the first leg 16 is welded to the horizontal frame member 12 by one or more overlap welds 28 at an edge 29 of that first leg spaced from the second leg 17 of the gusset 15. Preferably, the gusset 15 also is welded by one or more overlap welds to the vertical frame member 13. By way of example, the second leg 17 is welded to the vertical frame member 13 by an overlap weld 31.

According to one illustrated embodiment, the horizontal frame member 12 is provided with a vertical extension 32 and the gusset is intimately connected at its second leg 17 to that vertical extension. The horizontal frame member 12, as shown, is also provided with a horizontal extension 33 laterally of its vertical extension 32 and that horizontal extension is intimately connected to &he vertical frame member 13.

A preferred embodiment of the invention stiffens the gusset 15 and the horizontal frame member 12 by providing the first leg 16 with a vertical extension 35 spaced from and in parallel to the second leg 17. During an earthquake, this effectively resists twisting of the frame base member 12 where the anchor bolts 25 tie it to the ground. A further extension (not shown) may be added to the extension 35 to extend in parallel to the first leg 16 and spaced therefrom.

The vertical frame member 13, as shown, is preferably provided as an L-shaped channel member 40 having along one edge 41 of one leg 42 of that L-shaped channel member a first extension 43 in parallel to the other leg 44 of that L-shaped channel member, and having along one edge 45 of that other leg 44 of the L-shaped channel member an extension 46 in parallel to the one leg 42 of the L-shaped channel member.

As seen in the drawings, this results in a stylized G-shaped cross-section or profile of the vertical frame member. The vertical frame member 13 is thus stiffened against the kind of harmonic oscillations which often occur during earthquakes with devastating effects. For similar reasons, the horizontal frame member may be provided with a G-shaped kind of cross-section, including ledges 47, 48 and 49 therealong.

The horizontal frame member 12 is used as a base of the equipment rack 10 and the vertical frame member 13 is used as a first vertical frame member connected to that base by the metal gusset 15 as a first gusset. The rack 10 also includes a second vertical frame member 113 corresponding in shape to the first vertical frame member 13, and a second gusset 115 corresponding in shape to the first gusset 15. For best protection against earthquake damage, solid metal is also carried from the second vertical frame member 113 to the base member 12 by intimately connecting the second gusset 115 to that second vertical frame member and to that base member.

According to a further embodiment of the invention, a second horizontal frame member 112 is provided on top of the first and second vertical frame members 13 and 113. The top or second horizontal frame member 112 is provided with spaced first and second lateral tabs 51 and 52 extending over correspondingly spaced first and second portions 43 and 44 of the first vertical frame member 13, and with spaced third and fourth lateral tabs 151 and 152 extending over correspondingly spaced first and second portions 143 and 144 of the second vertical frame member 113. The top or second horizontal frame member 112 is intimately connected by overlap welds 56, 57, 58 and 59 at said first, second, third and fourth tabs 51, 52, 151 and 152 to the first and second portions 43 and 44, and 143 and 144, respectively, of the first and second vertical frame members 13 and 113.

This again provides a solid metal transition and overlap welds between vertical and horizontal frame members 13, 112 and 113 for superior earthquake protection of the rack 10. For the same reason, an embodiment of the invention provides the top or second horizontal frame member 112 with a fifth tab 61 extending onto a third portion 42 of the first vertical frame member 13 between the first and second portions 43 and 44 of that first vertical frame member, and with a sixth tab 161 extending onto a third portion 142 of the second vertical frame member 113 between the first and second portions 143 and 144 of that second vertical frame member. The top or second horizontal frame member 112 is intimately connected by overlap welds 66 and 67 at the fifth and sixth tabs 61 and 161 to the portions 42 and 142 of the first and second vertical frame members.

Figure 3:
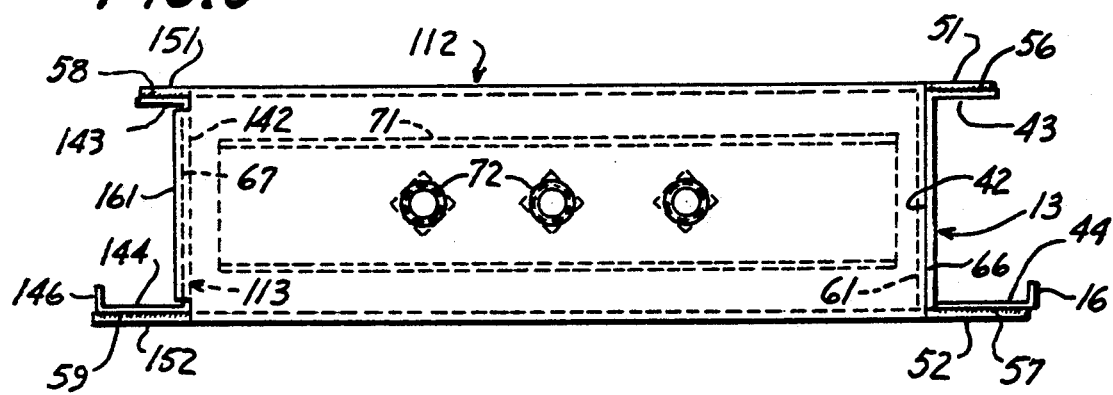
FIG. 3 is a top view, on an enlarged scale, of a top portion of an electronic equipment rack braced against earthquake damage in the manner shown in FIG. 2.

It may be noted in this respect that the upper right-hand corner of FIG. 1 and the right-hand end of FIG. 3 show a version wherein the tab 61 of the top frame member 112 abuts the portion 42 of the vertical frame member from the side, while the corresponding tab extension 161 reaches over and down the outer surface of the vertical frame member portion 142 as shown at the left-hand end of FIG. 3. In practice, the fabricator will select the version best suited for a particular task and the one providing best earthquake protection under the circumstances.

As shown in dotted outline within FIG. 3, a U-shaped channel member 71 may be positioned inside the top horizontal member and may be integrated therewith for greater rigidity against earthquakes. Welding nuts 72 may be used for that purpose. Corresponding downwardly extending portions of frame member 112 and channel member 71 may abut, even though shown as spaced in FIG. 3.

An illustrated preferred embodiment of the invention thus provides an electronic equiPment rack 10 including a pair of spaced vertical frame members 13 and 113, a horizontal base frame member 12 and a horizontal top frame member 112 extending between these vertical frame members and being braced against earthquake damage by the improvement comprising a combination of elements.

In particular, a first metal gusset 15 is intimately connected to the horizontal base frame member 12 and a first one of the vertical frame members 13 and includes a first leg 16 fitting against the horizontal base frame member and extending along part of that horizontal base frame member 12. The gusset 15 includes a second leg 17 having a first part 18 fitting against the first vertical frame member and extending along part of that first vertical frame member 13, includes a third leg 19 spaced from and extending in parallel to a second part 20 of the second leg, and includes a fourth leg 21 extending between the second and third legs in abutment with another part 23 of the first vertical frame member 13.

That combination also includes a second metal gusset 115 intimately connected to the horizontal base frame member 12 and the second one of the above mentioned pair of vertical frame members 113 and including a first leg 116 fitting against the horizontal base frame member and extending along part of that horizontal base frame member 12, including a second leg 117 having a first part fitting against the second vertical frame member and extending along part of that second vertical frame member 113, including a third leg 119 spaced from and extending in parallel to a second part of the second leg of that second gusset 115, and including a fourth leg 121 extending between the second and third legs 117 and 119 of the second gusset in abutment with another part 123 of the second vertical frame member 113.

The second and third legs 117 and 119 may be provided with tabs 217 and 219, respectively, for connection to the horizontal base frame member 12, such as at its ledge 48. That design may also be applied to the first gusset 15, such as when it is desired to apply the subject invention to construction of the type of equipment rack known as Network Bay and used by AT&T and the Bell Operating Companies.

Spaced first and second lateral tabs 51 and 52 on the horizontal top frame member 112 extend over correspondingly spaced first and second portions 43 and 44 of the first vertical frame member 13, and spaced third and fourth lateral tabs 151 and 152 on the horizontal top frame member extend over correspondingly spaced first and second portions 143 and 144 of the second vertical frame member 113, and overlap welds 56, 57, 58 and 59 at the first, second, third and fourth tabs 51, 52, 151 and 152 and the first and second portions 43 and 44 or 143 and 144 of the first and second vertical frame members 13 and 113 complete the earthquake-resistant rack structure 10.

Alternatively or additionally within the scope of the invention, the second horizontal frame member has a fifth tab 61 extending onto a third portion 42 of the first vertical frame member between the first and second portions 43 and 44 of that first vertical frame member 13, and a sixth tab 161 extending onto a third portion 142 of the second vertical frame member between the first and second portions 143 and 144 of that second vertical frame member 113, and overlap welds 66 and 67 at the fifth and sixth tabs 61 and 161 and further portions 42 and 142 of the first and second vertical frame members 13 and 113 further fortify the rack structure 10 against earthquake damage.

While no specific electronic equipment has been shown in the drawings, it is clear that the racks according to the subject invention can be used in the usual manner to support telephonic, broadcasting, and other electronic equipment.

The subject extensive disclosure will render apparent or suggest to those skilled in the art various modifications and variations within the spirit and scope of the subject invention and equivalents thereof.

We claim:

1. In a method of bracing an electronic equipment rack including a horizontal frame member and a vertical frame member against earthquake damage, the improvement comprising in combination the steps of:
   providing a metal gusset for said horizontal and vertical frame members wherein the gusset has a first leg fitting against said horizontal frame member to extend along part of that horizontal frame member, a second leg integrally connected to and extending from a lateral edge of the first leg and fitting against said vertical frame member for a first part of said second leg to extend along part of that vertical frame member, a third leg spaced from and extending in parallel to a second part of said second leg, and a fourth leg extending between and integrally connected to lateral edges of said second and third legs to abut against another part of said vertical frame member; and
   carrying solid metal from said vertical frame member to said horizontal frame member by intimately connecting said gusset to said vertical and horizontal frame members by overlap welding.

2. A method as in claim 1, wherein:
   said gusset is intimately connected at said first leg to said horizontal frame member.

3. A method as in claim 1, wherein:
   said gusset is bolted at said first leg to said horizontal frame member.

4. A method as in claim 1, wherein:
   said first leg is welded to said horizontal frame member by an overlap weld at an edge of said first leg spaced from said second leg.

5. A method as in claim 1, wherein
   said gusset is welded by overlap weld to said vertical frame member.

6. A method as in claim 1, wherein:
   said second leg is welded to said vertical frame member by an overlap weld.

7. A method as in claim 1, including the steps of:
   providing said horizontal frame member with a vertical extension; and
   intimately connecting said gusset at said second leg to said vertical extension.

8. A method as in claim 7, including the steps of:
   providing said horizontal frame member with a horizontal extension laterally of said vertical extension; and
   intimately connecting said horizontal extension to said vertical frame member.

9. A method as in claim 1, including the step of:
   stiffening said gusset and said horizontal frame member by providing said first leg with a vertical extension spaced from and in parallel to said second leg.

10. A method as in claim 1, including the step of:
    providing said vertical frame member as an L-shaped channel member having along one edge of one leg of said L-shaped channel member a first extension in parallel to the other leg of said L-shaped channel member, and having along one edge of said other leg of the L-shaped channel member an extension in parallel to said one leg of the L-shaped channel member.

11. A method as in claim 1, including the steps of:
    using said horizontal frame member as a base;
    using said vertical frame member as a first vertical frame member connected to said base by said metal gusset as a first gusset;
    providing a second vertical frame member corresponding in shape to said first vertical frame member;
    providing a second gusset corresponding in shape to said first gusset;
    carrying solid metal from said second vertical frame member to said base member by intimately connecting said second gusset to said second vertical frame member and to said base member;
    providing a second horizontal frame member on top of said first and second vertical frame members;
    providing said second horizontal frame member with spaced first and second lateral tabs extending over correspondingly spaced first and second portions of said first vertical frame member, and with spaced third and fourth lateral tabs extending over correspondingly spaced first and second portions of said second vertical frame member; and
    intimately connecting said second horizontal frame member by overlap welds at said first, second, third and fourth tabs to said first and second portions of said first and second vertical frame members.

12. A method as in claim 11, including the steps of:
    providing said second horizontal frame member with a fifth tab extending onto a third portion of said first vertical frame member between said first and second portions of that first vertical frame member, and with a sixth tab extending onto a third portion of said second vertical frame member between said first and second portions of that second vertical frame member; and
    intimately connecting said second horizontal frame member by overlap welds at said fifth and sixth tabs to further portions of said first and second vertical frame members.

13. An electronic equipment rack including a horizontal frame member and a vertical frame member braced against earthquake damage by the improvement comprising in combination:
    a metal gusset intimately connected to said horizontal and vertical frame members by overlap welds and including a first leg fitting against said horizontal frame member and extending along part of that horizontal frame member, a second leg integrally connected to and extending from a lateral edge of the first leg and having a first part fitting against said vertical frame member and extending along part of that vertical frame member, a third leg spaced from and extending in parallel to a second part of said second leg, and fourth leg extending between and integrally connected to lateral edges of said second and third legs and in abutment with another part of said vertical frame member.

14. Apparatus as in claim 13, including:
    means for intimately connecting at said first leg to said horizontal frame member.

15. Apparatus as in claim 13, including:
means for bolting said first leg to said horizontal frame member.

16. Apparatus as in claim 13, including:
an overlap weld between said horizontal frame and an edge of said first leg spaced from said second leg.

17. Apparatus as in claim 13, including:
an overlap weld between said gusset and said vertical frame member.

18. Apparatus as in claim 13, including:
an overlap weld between said second leg and said vertical frame member.

19. Apparatus as in claim 13, werein:
said horizontal frame member has a vertical extension intimately connected to said gusset at said second leg.

20. Apparatus as in claim 19, wherein:
said horizontal frame member has a horizontal extension laterally of said vertical extension intimately connected to said vertical frame member.

21. Apparatus as in claim 13, wherein:
said first leg has a vertical extension spaced from and extending in parallel to said second leg.

22. Apparatus as in claim 13, wherein:
said vertical frame member has an L-shaped channel member having along one edge of one leg of that L-shaped channel member a first extension in parallel to the other leg of that L-shaped channel member, and has along one edge of said other leg of the L-shaped channel member an extension in parallel to said one leg of the L-shaped channel member.

23. An electronic equipment rack including a pair of spaced vertical frame members, a horizontal base frame member and a horizontal top frame member extending between said vertical frame members and being braced against earthquake damage by the improvement comprising in combination:
a first metal gusset intimately connected to said horizontal base frame member and a first one of said vertical frame members by overlap welds and including a first leg fitting against said horizontal base frame member and extending along part of that horizontal base frame member, a second leg integrally connected to and extending from a lateral edge of the first leg and having a first part fitting against said first vertical frame member and extending along part of that first vertical frame member, a third leg spaced from and extending in parallel to a second part of said second leg, and a fourth leg extending between and integrally connected to lateral edges of said second and third legs and in abutment with another part of said first vertical frame member;
a second metal gusset intimately connected to said horizontal base frame member and the second one of said pair of vertical frame members by overlap welds and including a first leg fitting against said horizontal base frame member and extending along part of that horizontal base frame member, a second leg integrally connected to and extending from a lateral edge of the first leg and having a first part fitting against said second vertical frame member and extending along part of that second vertical frame member, a third leg spaced from and extending in parallel to a second part of said second leg of said second gusset, and a fourth leg extending between and integrally connected to lateral edges of said second and third legs of said second gusset and in abutment with another part of said second vertical frame member;
spaced first and second lateral tabs on said horizontal top frame member extending over correspondingly spaced first and second portions of said first vertical frame member, and spaced third and fourth lateral tabs on said horizontal top frame member extending over correspondingly spaced first and second portions of said second vertical frame member; and overlap welds at said first, second, third and fourth tabs and said first and second portions of said first and second vertical frame members.

24. Apparatus as in claim 23, wherein:
said second horizontal frame member has a fifth tab extending onto a third portion of said first vertical frame member between said first and second portions of that first vertical frame member, and a sixth tab extending onto a third portion of said second vertical frame member between said first and second portions of that second vertical frame member; and
overlap welds at said fifth and sixth tabs and further portions of said first and second vertical frame members.

25. A method as in claim 1, wherein:
said third and fourth legs are formed with said second part of the second leg into a channel-shaped structure extending in one piece with said first part of said second leg above said horizontal frame member into abutment with said vertical frame member.

26. In a method of bracing an electronic equipment rack including a horizontal frame member and a vertical frame member against earthquake damage, the improvement comprising in combination the steps of:
providing a channel-shaped structure along a lateral part of said horizontal frame member and into abutment with a first flange of said vertical frame member;
providing said channel-shaped structure with an extension along a second flange of said vertical frame member;
providing said channel-shaped structure and said extension thereof with a leg extending along part of said horizontal frame member, said extension being in one piece with said channel-shaped structure and secured to said second flange of the vertical frame member, and said leg being in one piece with said channel-shaped structure and with said extension of the channel-shaped structure and secured to said horizontal frame member; and
securing said leg and said extension to said horizontal and vertical frame members, respectively, by overlap welding.

27. Apparatus as in claim 13, including;
a channel-shaped structure including said second part of the second leg, said third leg and said fourth leg, and extending in one piece with said first part of said second leg above said horizontal frame member into abutment with the vertical frame member.

28. Apparatus as in claim 23, including:
overlap welds between said first and second legs of said first and second gussets and said horizontal base frame member and vertical frame members.

29. An electronic equipment rack including a horizontal frame member and a vertical frame member braced against earthquake damage by the improvement comprising in combination:

a channel-shaped structure extending along a lateral part of the horizontal frame member into abutment with a first flange of the vertical frame member; and an extension of the channel-shaped structure along a second flange of the vertical frame member in one piece with said channel-shaped structure and secured to said second flange of the vertical frame member;

said channel-shaped member having a leg extending in one piece with said channel-shaped structure and with said extension along part of said horizontal frame member and secured to said horizontal frame member; and overlap welds between said leg and said extension and said horizontal and vertical frames members, respectively.

* * * * *